(12) United States Patent
Wang

(10) Patent No.: US 8,170,821 B2
(45) Date of Patent: May 1, 2012

(54) AUTOMATIC SIGNAL IDENTIFYING METHOD AND AUTOMATIC SIGNAL SKEW MEASUREMENT METHOD

(75) Inventor: Shang-Yi Wang, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 589 days.

(21) Appl. No.: 12/356,062

(22) Filed: Jan. 19, 2009

(65) Prior Publication Data
US 2009/0192739 A1     Jul. 30, 2009

(30) Foreign Application Priority Data
Jan. 30, 2008  (TW) .............................. 97103468 A

(51) Int. Cl.
*G01R 13/00* (2006.01)
(52) U.S. Cl. ........................................................ 702/67
(58) Field of Classification Search ..................... 702/67
See application file for complete search history.

(56) References Cited

U.S. PATENT DOCUMENTS 5,138,252 A    8/1992   Ferguson
5,686,846 A   11/1997   Holcomb et al.
6,246,408 B1   6/2001   Alexander
6,892,150 B2   5/2005   Pickerd et al.

OTHER PUBLICATIONS

Tektronix ,XYZs of Oscilloscopes, p. 1-64, 2001.*

* cited by examiner

*Primary Examiner* — Tung S Lau
(74) *Attorney, Agent, or Firm* — Jianq Chyun IP Office

(57) ABSTRACT

In order to automatically measure a signal skew between a first test signal and a second test signal by using an oscilloscope, a method is provided by the present invention. The method includes: capturing a band center of the first test signal; capturing a first sampling point and a second sampling point of the second test signal; comparing a voltage difference between the first sampling point and the second sampling point of the second test signal with a threshold value so as to decide and capture a rising band center and a falling band center of the second test signal. By using the invented method, the signal skew between the first test signal and the second test signal can be calculated according to the band center of the first test signal, the rising band center and the falling band center of the second test signal.

6 Claims, 7 Drawing Sheets

AUTOMATIC SIGNAL IDENTIFYING METHOD AND AUTOMATIC SIGNAL SKEW MEASUREMENT METHOD

CROSS-REFERENCE TO RELATED APPLICATION

This application claims the priority benefit of Taiwan application serial no. 97103468, filed Jan. 30, 2008. The entirety of the above-mentioned patent application is hereby incorporated by reference herein and made a part of specification.

BACKGROUND OF THE INVENTION

1. Field of the Invention

The present invention relates to an automatic signal identifying method and an automatic signal skew measurement method with an oscilloscope.

2. Description of Related Art

In order to use an oscilloscope (for example, a digital oscilloscope) measuring a signal skew between two signals nowadays, it is needed to artificially identify the band center positions of the two test signals. A signal package of some test signals comprises signals of different types. For example, a test signal may be the one mixed up by rising signals, falling signals and non-transition signals. However, in the prior art, there is no solution to directly extract the three types of signals with an oscilloscope operated by a measurer. The conventional way to measure the distance between the band center positions of different signals and thereby to measure the signal skew of the signals is that the band center positions of the accumulated test signals are artificially identified on an oscilloscope screen by a measurer, then the displaying positions are manually adjusted, and the reading value of a cursor on the oscilloscope's screen is read.

It is obvious that the conventional measurement scheme is unable to be automatically conducted. In addition, the manually adjusting result is varied with different measurers, which may affect the measured result.

In this regard, it is expected by the relevant companies to have an automatic signal identifying method and an automatic signal skew measurement method with an oscilloscope, by which the signal types of test signals can be automatically identified during measuring a signal skew between at least two test signals and the band center positions of the accumulating signal of the test signals can be obtained so as to further calculate the signal skew of the two test signals.

SUMMARY OF THE INVENTION

Accordingly, the present invention is directed to an automatic signal skew measurement method with an oscilloscope, wherein the displaying position of a signal is automatically adjusted instead of artificially adjusting the displaying position of a signal by an operator.

The present invention is also directed to an automatic signal skew measurement method with an oscilloscope, wherein the signal skew between test signals is automatically identified instead of artificially identifying the signal skew between the signals by a measurer.

The present invention is further directed to an automatic signal identifying method capable of extracting different waveforms from a signal to facilitate measuring a signal skew.

An embodiment of the present invention provides a method of automatically identifying the type of signal transition suitable for an oscilloscope. The method of automatically identifying the type of signal transition includes: establishing a database of signal transition durations; setting a record length according to the database of signal transition durations; capturing a first sampling point and a second sampling point of a test signal according to the record length; comparing a voltage difference between the first sampling point and the second sampling point of the test signal with a threshold value so as to identify the type of the test signal.

Another embodiment of the present invention provides a signal skew measurement method suitable for an oscilloscope. The signal skew measurement method includes capturing a signal measuring point of a first test signal by using the oscilloscope; establishing a database of signal transition durations; setting a record length according to the database of signal transition durations; capturing a first sampling point and a second sampling point of a second test signal according to the record length; comparing a voltage difference between the first sampling point and the second sampling point of the second test signal with a threshold value so as to identify a rising signal measuring point and a falling signal measuring point of the second test signal; calculating a signal skew between the first test signal and the second test signal according to the signal measuring point of the first test signal and the rising signal measuring point and falling signal measuring point of the second test signal.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following, the depicted embodiments together with the included drawings are intended to explain the feasibility of the present invention, wherein a same notation or a similar notation is for marking the same or the similar portions. Note that the diagrams are simplified and not in an accurate scale to the real objects. In addition, some of expression words hereinafter regarding direction or orientation, such as 'upper', 'lower', 'left', 'right', 'up', 'down', 'up from', 'down from', 'lower', 'behind' and 'in front', and the like, are to describe, not to limit, the present invention.

Figure 1:
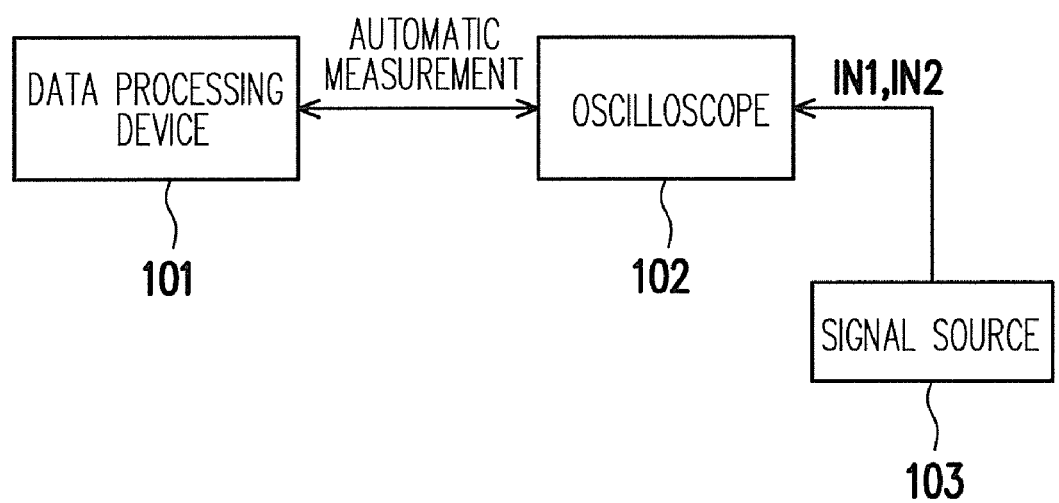
FIG. 1 is a diagram of a measuring system applicable to the embodiments of the present invention.

FIG. 1 is a diagram of a measuring system applicable to the embodiments of the present invention. Referring to FIG. 1, a data processing device 101 has at least an electrical linking function and a data processing function, and the data processing device 101 is, for example, a personal computer (PC) or a notebook computer. By using the electrical linking function, the data processing device 101 is able to receive the output and the data from an oscilloscope 102 in the measuring system, control the oscilloscope 102 and deliver a calculating/operating result to the oscilloscope 102. The measuring system further has a signal source 103 to provide the oscilloscope 102 with at least two test signals IN1 and IN2. The oscilloscope 102 is, for example, a digital oscilloscope. When, for example, a signal skew between two signals from two different ports in an IEEE-1394 interface of a motherboard needs to be measured, the signal source 103 is just the motherboard with the IEEE-1394 interface to be tested, and both the test signals IN1 and IN2 are IEEE-1394 signals. Certainly, anyone skilled in the art can use the present invention to measure signals of other types, for example, a signal with a USB interface, a clock signal of an electronic system, and the like.

For depiction convenience, it is assumed hereinafter that as capturing the test signal IN1, the rising waveform thereof needs to be captured firstly; as capturing the test signal IN2, all of the rising waveform, falling waveform and non-transition waveform thereof need to be captured. And, when a rising waveform of the test signal IN2 is captured, the test signal IN2 is identified as a rising signal; when a falling waveform of the test signal IN2 is captured, the test signal IN2 is identified as a falling signal; when a constant waveform of the test signal IN2 is captured, the test signal IN2 is identified as a non-transition signal. Note that in fact all the test signals IN1 and IN2 are signals containing rising waveforms, falling waveforms and non-transition waveforms (i.e., constant waveforms). The above-mentioned waveforms of the signals IN1 and IN2 are the interested ones of the present invention and need to be captured for identifying.

The First Embodiment

In the first embodiment of the present invention, a program stored in the data processing device 101 is used to automatically identify a signal type.

Figure 2:
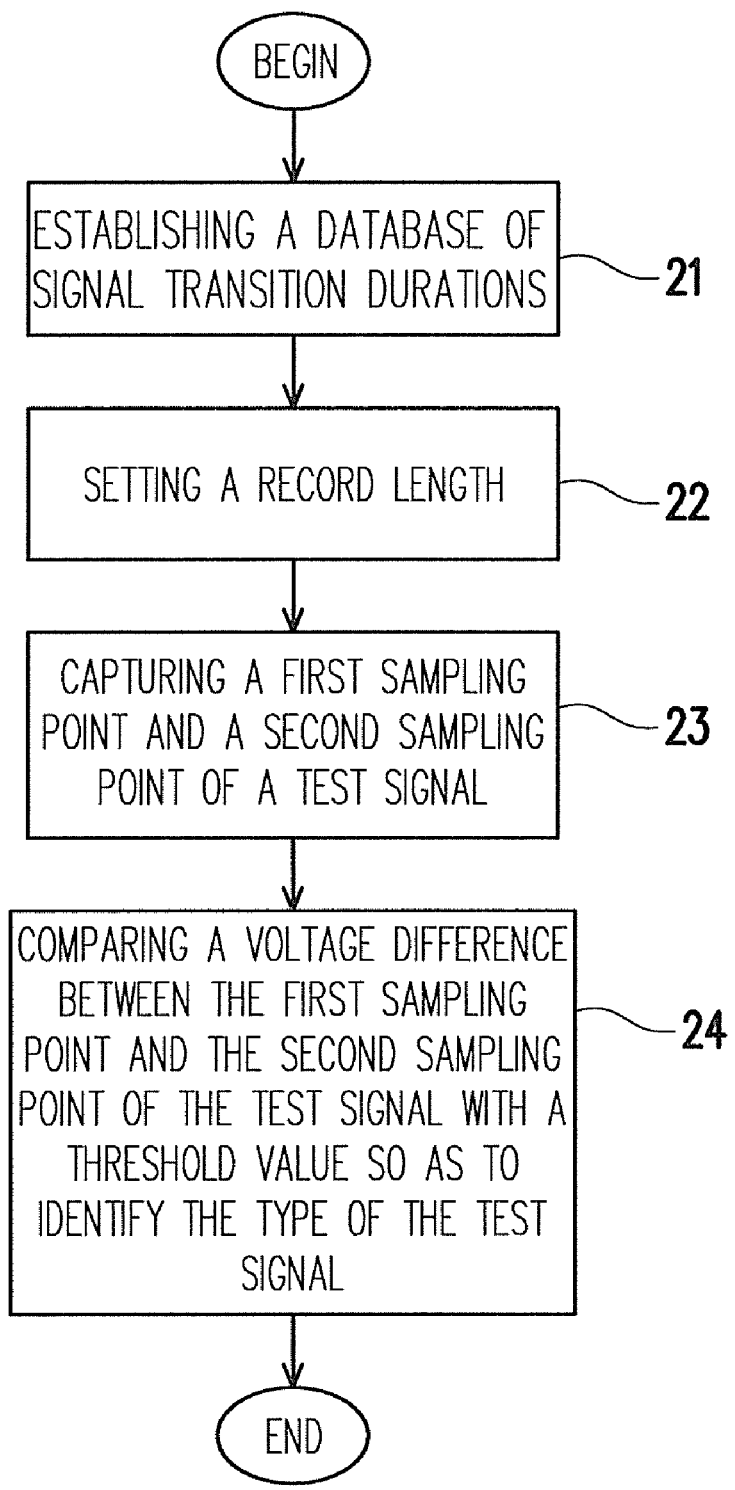
FIG. 2 is a flowchart of a method of automatically identifying the type of a signal according to the first embodiment of the present invention.
Figure 3:
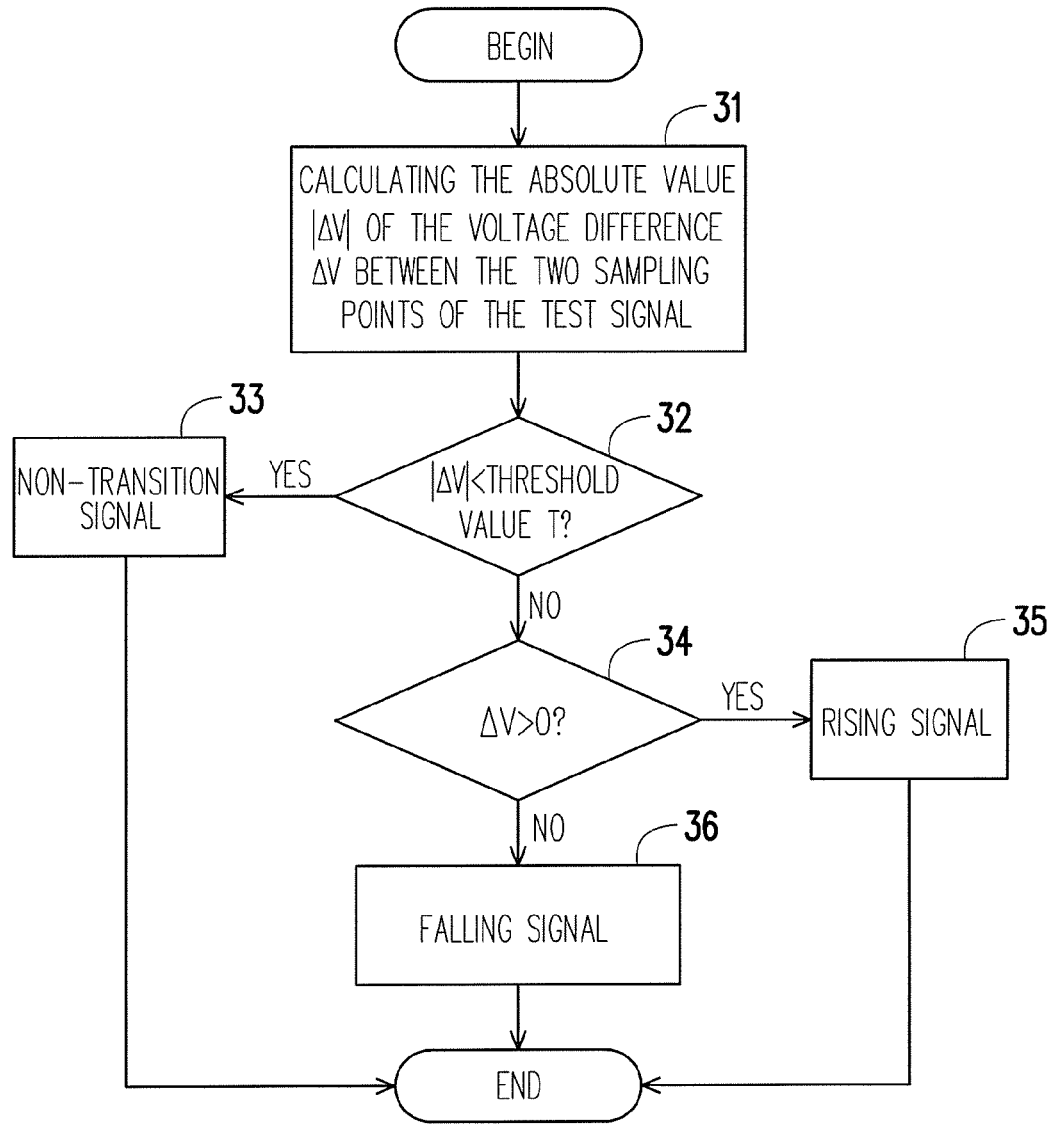
FIG. 3 is a flowchart for identifying the waveband type of a test signal according to a threshold value and a voltage difference.
Figure 4A:
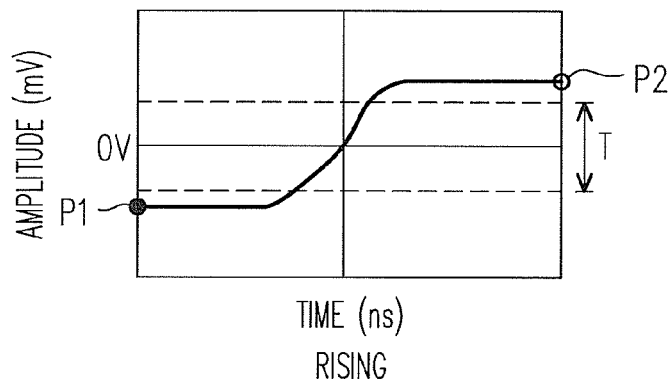
FIGS. 4a-4c are diagrams showing a rising signal, a falling signal and a non-transition signal.
Figure 4B:
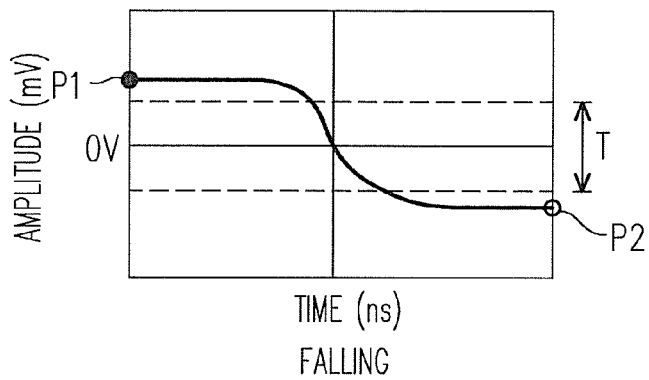
Figure 4C:
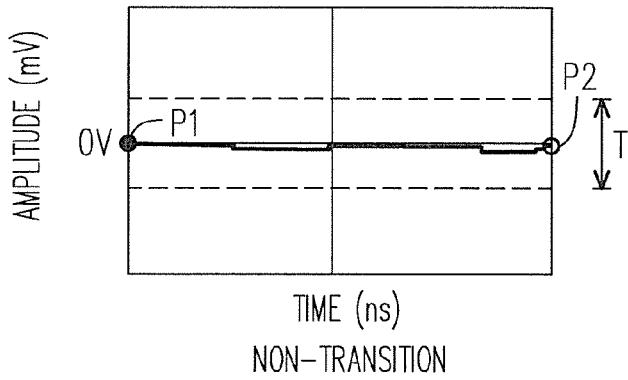

Referring to FIGS. 2-4c, wherein FIG. 2 is a flowchart of a method of automatically identifying the type of a signal according to the first embodiment of the present invention, FIG. 3 is a flowchart for identifying the waveband type of a test signal according to a threshold value and a voltage difference and FIGS. 4a-4c are diagrams showing a rising signal, a falling signal and a non-transition signal.

First in step S21, a database of signal transition durations is established in a data processing device 101. The database of signal transition durations is used to determine a time length required for a transition of the test signal IN2, so that a required waveband during sampling the test signal IN2 is captured without missing. In other words, two sampling points determined by the time length are set so that the sampling course between the two sampling points can cover a transition waveform of the test signal IN2, if the test signal IN2 has a transition state.

Next in step S22, a record length of the oscilloscope 102 is set according to the established database of signal transition durations, wherein the record length can be, for example, 5,000 sampling points or 10,000 sampling points depending on the specification and the performance of the oscilloscope 102.

Then in step S23, a first sampling point P1 and a second sampling point P2 of the test signal IN2 are captured, wherein the first sampling point P1 and the second sampling point P2 can be, for example, both end sampling points of 5,000 sampling points. Additionally, in order to conveniently find out the position of the test signal IN2, a database of signal skew is established by the measurer in the data processing device 101, wherein the database of signal skew at least includes horizontal delay parameters and horizontal scale parameters. The following table is an example of the database of signal skew.

|        | horizontal delay parameter | horizontal scale parameter |
|--------|---------------------------|----------------------------|
| A(100) | 7E−8                      | 2E−10                      |
| A(200) | 3.5E−8                    | 2E−10                      |
| A(400) | 1.7E−8                    | 2E−10                      |
| B(100) | 2E−8                      | 2E−10                      |
| B(200) | 1E−8                      | 2E−10                      |
| B(400) | 5E−9                      | 2E−10                      |
| C(100) | E−8                       | 2E−10                      |
| C(200) | 2.5E−8                    | 2E−10                      |
| C(400) | 1.25E−8                   | 2E−10                      |
| D(100) | 5.08E−8                   | 2E−10                      |
| D(200) | 2.54E−8                   | 2E−10                      |
| D(400) | 1.27E−8                   | 2E−10                      |

A-D in the table represent different suppliers of IEEE-1394 chips, A(100) represents a specification of the chip of the supplier A, and analogically for the rest notations.

After that, in step 24, the absolute value |V| of the voltage difference V between the first sampling point P1 and the second sampling point P2 of the test signal IN2 is compared with a threshold value so as to identify the waveband type of the test signal IN2.

The scheme of identifying the waveband type of the test signal IN2 according to the threshold value T and the absolute value |V| of the voltage difference is explained as follows referring to FIGS. 3 and 4a-4c.

Referring to FIG. 3, in step S3 1, the absolute value |V| of the voltage difference V between the two sampling points P1 and P2 of the test signal IN2 is calculated, wherein P1 and P2 are, for example, both end sampling points of 5,000 sampling points, the voltage difference V=V2−V1, and V1 and V2 respectively represent the voltages at the head sampling point P1 and the end sampling point P2. Controlled by the data processing device 101, the oscilloscope 102 sends all the record data (including time points and voltages) of the sampling points to the data processing device 101, so that the data processing device 101 thereby calculates the absolute value |V| of the voltage difference V between the two sampling points.

Further in step 32, it is judged by the data processing device 101 whether or not the absolute value |V| is less than the threshold value T. If the absolute value |V| is less than the threshold value T, the voltage difference between the two sampling points is minor, so that the test signal IN2 is identified as a non-transition signal as shown by step 33. In other words, the captured test signal IN2 has no transition between the sampling points, and the test signal may take a logic-high level or a logic-low level between the sampling points so that there is no transition at all, shown by FIG. 4c. FIG. 4c illustrates a measured test signal IN2 as a non-transition signal (the signal may just take a logic-high state or a logic-low state).

Furthermore in step 34, the data processing device 101 judges whether the voltage difference V is positive or negative. If the voltage difference V is positive, the test signal IN2 is identified as a rising signal as shown by step 35. FIG. 4a illustrates a measured test signal IN2 between the sampling points P1 and P2 and the captured signal IN2 is identified as a rising waveform.

If the voltage difference V is negative, the test signal IN2 is identified as a falling signal as shown by step 36. FIG. 4b illustrates a measured test signal IN2 between the sampling points P1 and P2 and the captured signal IN2 is identified as a falling waveform.

The above-described method of automatically identifying the type of a signal provides a solution to overcome the problem in the prior art where signal types are unable to be manually identified and extracted.

The Second Embodiment

Figure 5:
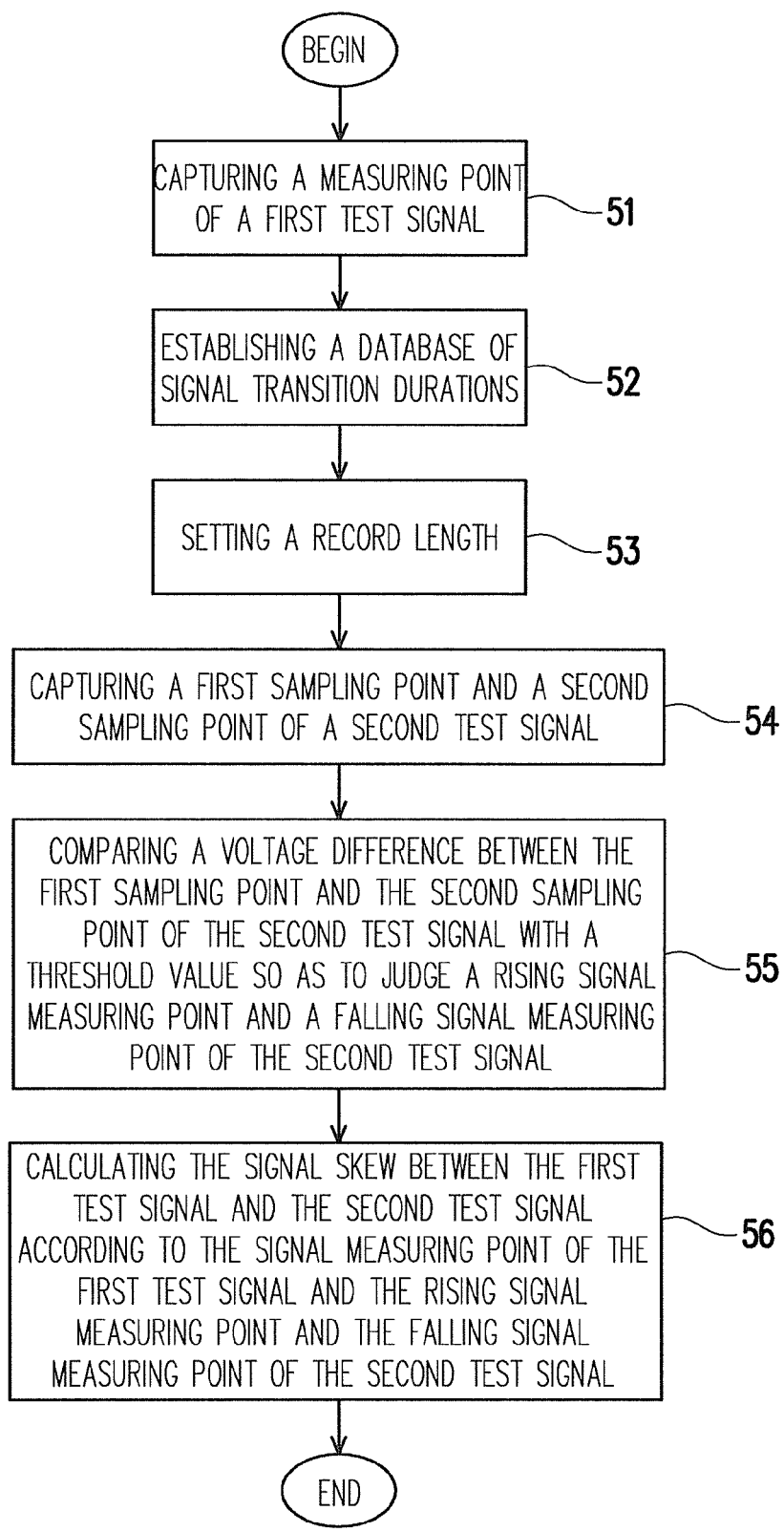
FIG. 5 is a flowchart of a signal skew measurement method by using an oscilloscope according to the second embodiment of the present invention.
Figure 6:
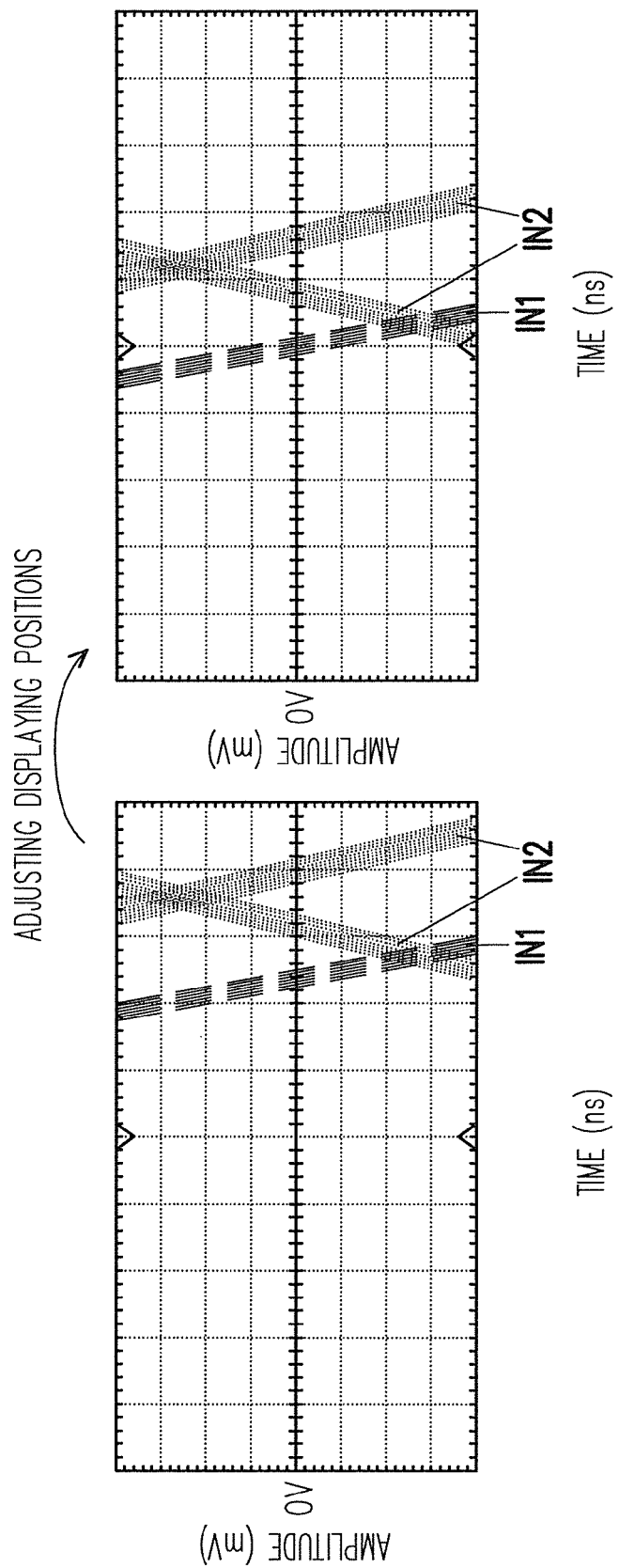
FIG. 6a is a displaying image on an oscilloscope showing test signals IN1 and IN2 without adjusting the displaying positions thereof.
FIG. 6b is a displaying image on an oscilloscope showing the test signals IN1 and IN2 after adjusting the displaying positions thereof.
Figure 7:
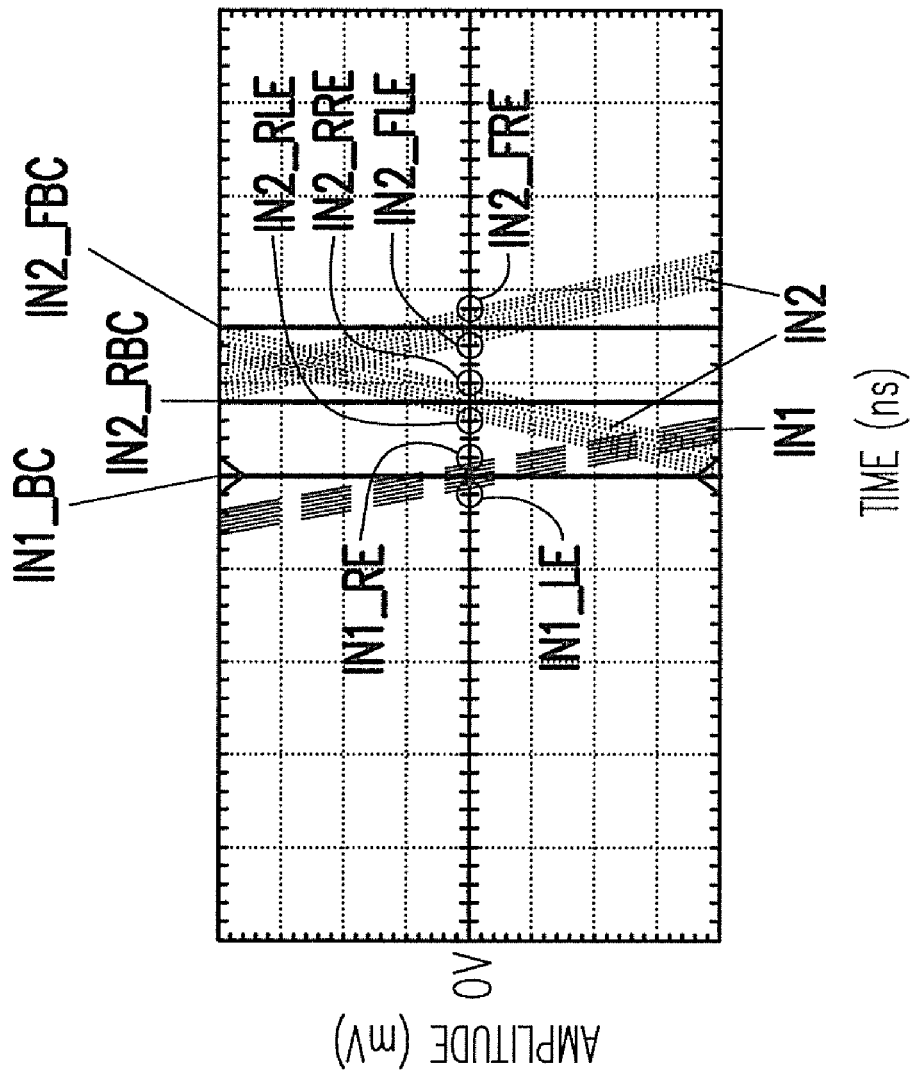
FIG. 7 is a displaying diagram on an oscilloscope showing the band center IN1_BC of the first test signal IN1, the rising band center IN2_RBC and falling band center IN2_FBC of the second test signal IN2.

In the second embodiment of the present invention, a signal skew between two test signals is automatically calculated by using a program stored in a data processing device 101. Referring to FIGS. 5-7, wherein FIG. 5 is a flowchart of a signal skew measurement method by using an oscilloscope according to the second embodiment of the present invention.

In step 51, a signal measuring point of the first test signal IN1 is captured by an oscilloscope 102. For depiction convenience, the signal measuring point of the first test signal IN1 is, for example, the band center IN1_BC shown by FIG. 7. The signal measuring point can be other positions of the first test signal IN1, for example, a position of position of left-edge IN1_LE or a position of right-edge IN1_RE of the first test signal IN1. Preferably, the signal measuring point of the first test signal IN1 is chosen correspondingly to a reference voltage (for example, voltage=0V) where the first test signal curve passes.

Ideally, only a waveform respectively corresponding to the first test signal IN1 and the second test signal IN2 are captured. However in fact, there may be more than one waveform within a range for the first test signal IN1 or the second test signal IN2 are captured as shown in FIG. 7, which is caused by signal jitter.

In order to capture a band center, the data processing device 101 automatically starts the signal-overlapping function and the data histogram box function of the oscilloscope 102, so that a minimal value of the accumulated signal and a maximal value of the accumulated signal of the first test signal IN1 corresponding to a reference voltage (for example, voltage=0V) are obtained. Note that in prior art, the signal-overlapping function and the data histogram box function are manually started by the measurer. The signal histogram box function is for conducting statistics on the time points of the test signal IN1, i.e., the intersection points of the test signal IN1 and a reference axis (for example, voltage amplitude=0V), and the counting number of the intersections. Then, the data processing device 101 calculates the band center IN1_BC of the first test signal IN1 according to the minimal value of the accumulated signal and the maximal value of the accumulated signal; the band center IN1_BC of the first test signal IN1 is defined by, for example, IN1_BC=(MAX+MIN)/2.

Note that the band center IN1_BC of the first test signal IN1, the position of left-edge IN1_LE and the position of right-edge IN1_RE of the first test signal IN1 as shown in FIG. 7 are referred to that of the accumulated (overlapped) first test signal IN1. That is to say, they are the band center of the first test signals IN1 after overlapping, and the position of left-edge and the position of right-edge of the first test signals IN1 after accumulating (overlapping).

The data processing device 101 can further adjust the displaying positions of the test signals IN1 and IN2 on the screen of the oscilloscope 102 according to the band center IN1_BC of the first test signal IN1, as shown by FIGS. 6a and 6b, wherein FIG. 6a is a displaying image on an oscilloscope showing test signals IN1 and IN2 without adjusting the displaying positions thereof and FIG. 6b is a displaying image on an oscilloscope showing the test signals IN1 and IN2 after adjusting the displaying positions thereof.

The step of automatically adjusting the displaying positions of the test signals is conducted to adapt the usual situation of a motherboard where the signal thereof always is varied with time somehow; therefore, the displaying positions of the test signals IN1/IN2 need to be adjusted to the center of the screen of the oscilloscope 102 for conveniently observing and measuring.

Next in step 52 as shown by FIG. 5, the measurer establishes a database of signal transition durations in the data processing device 101, and the method of establishing the database of signal transition durations can refer the first embodiment and is omitted herein for simplicity.

Then in step 53, a record length is set according to the established database of signal transition durations. Then in step 54, a first sampling point and a second sampling point of the second test signal IN2 are captured according to the record length. The implementations of step 53 and step 54 can refer the first embodiment and are omitted herein for simplicity.

Then in step 55, a rising signal measuring point and a falling signal measuring point of the second test signal IN2 are judged according to a threshold value T and a voltage difference V between the two sampling points of the second test signal IN2. For depiction convenience, the rising signal measuring point of the second test signal IN2 takes, for example, the rising band center IN2_RBC shown in FIG. 7. The rising signal measuring point of the second test signal IN2 can be other positions thereof, for example, a position of left-edge IN2_RLE of the rising signal or a position of right-edge IN2_RRE of the rising signal of the second test signal IN2. Similarly, a falling signal measuring point the second test signal IN2 takes, for example, the falling band center IN2_FBC shown in FIG. 7. The falling signal measuring point of the second test signal IN2 can be other positions thereof, for example, a position of left-edge IN2_FLE of the falling signal or a position of right-edge IN2_FRE of the falling signal of the second test signal IN2. Preferably, the rising signal measuring point and the falling signal measuring point of the second test signal IN2 are corresponding to a reference voltage (for example, voltage=0V).

Note that it can be seen from FIG. 7 that the rising band center IN2_RBC of the second test signal IN2, the position of left-edge IN2_RLE of the rising signal of the second test signal IN2, the position of right-edge IN2_RRE of the rising signal of the second test signal IN2, the falling band center IN2_FBC of the second test signal IN2, the position of left-edge IN2_FLE of the falling signal of the second test signal IN2 and the position of right-edge IN2_FRE of the falling signal of the second test signal IN2 are referred to that of the accumulated (overlapped) second test signal IN2. That is to say, they are the rising band center, the position of left-edge of the rising signal, the position of right-edge of the rising signal, the falling band center, the position of left-edge of the falling signal and the position of right-edge of the falling signal of the second test signals IN2 after accumulating (overlapping).

In order to judge the rising band center and the falling band center of the second test signal IN2, the second test signal IN2 needs to be sorted into several types and then the rising band, the falling band and the non-transition band are extracted from the second test signal IN2. The method of extracting the rising band, the falling band and the non-transition band from the second test signal IN2 can refer to the first embodiment and is omitted herein for simplicity.

All the time points, i.e. all the intersection points between the extracted rising band of the second test signal IN2 and the reference axis (for example, voltage=0V) are selected, followed by obtaining the rising band center of the rising band according to the maximal position value and the minimal position value of all the time points. The average of the maximal position value and the minimal position value of all the time points can be defined as the rising band center IN2_RBC of the rising band.

Similarly, all the time points, i.e. all the intersection points between the extracted falling band of the second test signal IN2 and the reference axis (for example, voltage=0V) are selected, followed by obtaining the falling band center of the falling band according to the maximal position value and the minimal position value of all the time points. The average of the maximal position value and the minimal position value of all the time points can be defined as the falling band center IN2_FBC of the falling band. The meanings of the band center IN1_BC of the first test signal IN1, the rising band center IN2_RBC and falling band center IN2_FBC of the second test signal IN2 can be understood referring to FIG. 7. FIG. 7 is a displaying diagram on an oscilloscope showing the band center IN1_BC of the first test signal IN1, the rising band center IN2_RBC and falling band center IN2_FBC of the second test signal IN2.

Then in step 56, the signal skew between the first test signal IN1 and the second test signal IN2 is calculated according to the band center IN1_BC of the first test signal IN1 and the rising band center IN2_RBC and falling band center IN2_FBC of the second test signal IN2, wherein a signal skew sk1 between the rising band of the first test signal IN1 and the rising band of the second test signal IN2 and a signal skew sk2 between the falling band of the first test signal IN1 and the falling band of the second test signal IN2 need to be respectively obtained, for example:

$$sk1 \text{ can be expressed by } sk1=(IN2\_RBC-IN1\_BC);$$
and $$sk2 \text{ can be expressed by } sk2=(IN2\_FBC-IN1\_BC)$$

Finally, the measurement results, the images on the screen of the oscilloscope 102 and other measurement data are sent to the data processing device 101 for storing, and it is judged whether or not the calculated signal skews ski and sk2 between the first test signal IN1 and the second test signal IN2 are acceptable by the data processing device 101 according to the specification of the IEEE-1394. The judgement result would be later displayed on the user interface of the data processing device 101.

In summary, by using the methods provided by the above-mentioned embodiments of the present invention, a user is able to automatically obtain the signal skew between two test signals through the data processing device 101 and further decide whether or not the signal skew is acceptable. In addition, the invented scheme is different from the conventional scheme where the parameters of the oscilloscope are manually set, but the parameters of the oscilloscope are automatically set by computer. The invented scheme largely reduces the operation complexity and increases the correctness of judging the signal skew.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of automatically identifying the type of signal transition, suitable for an oscilloscope, the method comprising:
    establishing a database of signal transition durations;
    setting a record length according to the database of signal transition durations;
    capturing a first sampling point and a second sampling point of a test signal according to the record length; and
    comparing using a processor a voltage difference between the first sampling point and the second sampling point of the test signal with a threshold value so as to identify the type of the test signal; the automatically identifying the type of signal transition wherein the step of identifying the type of the test signal obtaining an absolute value of the voltage difference; and wherein the step of comparing a voltage difference between the first sampling point and the second sampling point of the test signal with a threshold value so as to identify the type of the test signal further comprises: identifying the test signal as a falling signal if the absolute value of the voltage difference is greater than the threshold value and the voltage difference is less than zero.

2. The method of automatically identifying the type of signal transition according to claim 1, wherein the step of establishing a database of signal transition durations comprises:
    establishing the database of signal transition durations in a data processing device with electrical linking function.

3. The method of automatically identifying the type of signal transition according to claim 2, wherein the step of establishing a database of signal transition durations comprises:
    establishing a database of signal skew in the data processing device.

4. The method of automatically identifying the type of signal transition according to claim 1, wherein the step of identifying the type of the test signal comprises:
    obtaining an absolute value of the voltage difference.

5. The method of automatically identifying the type of signal transition according to claim 4, wherein the step of comparing a voltage difference between the first sampling point and the second sampling point of the test signal with a threshold value so as to identify the type of the test signal further comprises:
    identifying the test signal as a non-transition signal if the absolute value of the voltage difference is less than the threshold value.

6. The method of automatically identifying the type of signal transition according to claim 4, wherein the step of comparing a voltage difference between the first sampling point and the second sampling point of the test signal with a threshold value so as to identify the type of the test signal further comprises:
    identifying the test signal as a rising signal if the absolute value of the voltage difference is greater than the threshold value and the voltage difference is greater than zero.

* * * * *